United States Patent [19]
Stephens

[11] Patent Number: 6,114,895
[45] Date of Patent: Sep. 5, 2000

[54] INTEGRATED CIRCUIT ASSEMBLY HAVING OUTPUT PADS WITH APPLICATION SPECIFIC CHARACTERISTICS AND METHOD OF OPERATION

[75] Inventor: Charles S. Stephens, Corvallis, Oreg.

[73] Assignee: Agilent Technologies, Palo Alto, Calif.

[21] Appl. No.: 09/075,123

[22] Filed: May 8, 1998

Related U.S. Application Data

[63] Continuation-in-part of application No. 08/960,408, Oct. 29, 1997.

[51] Int. Cl.[7] .......................... H03K 17/16; H03K 19/003
[52] U.S. Cl. .......................... 327/391; 327/112; 327/384; 326/27; 326/30; 326/86; 326/83
[58] Field of Search .................... 327/379, 380, 327/381, 389, 391, 108, 111, 112, 170, 384; 326/26, 27, 30, 34, 87, 83, 86

[56] References Cited

U.S. PATENT DOCUMENTS

| | | | |
|---|---|---|---|
| 4,567,378 | 1/1986 | Raver | 326/27 |
| 4,719,369 | 1/1988 | Asano et al. | 326/30 |
| 4,825,099 | 4/1989 | Barton | 326/86 |
| 4,877,980 | 10/1989 | Kubinec | 327/110 |
| 4,906,867 | 3/1990 | Petty | 326/27 |
| 4,952,818 | 8/1990 | Erdelyi et al. | 327/108 |
| 4,962,345 | 10/1990 | Crafts et al. | 327/170 |
| 5,013,940 | 5/1991 | Ansel | 326/27 |
| 5,039,874 | 8/1991 | Anderson | 327/109 |
| 5,039,878 | 8/1991 | Armstrong et al. | 327/512 |
| 5,099,149 | 3/1992 | Smith | 327/38 |
| 5,118,971 | 6/1992 | Schenck | 326/32 |
| 5,140,591 | 8/1992 | Palara et al. | 327/109 |
| 5,166,558 | 11/1992 | Ohsawa | 326/71 |
| 5,206,544 | 4/1993 | Chen et al. | 326/30 |
| 5,216,293 | 6/1993 | Sei et al. | 326/83 |
| 5,220,208 | 6/1993 | Schenck | 326/27 |
| 5,237,213 | 8/1993 | Tanoi | 327/205 |
| 5,300,830 | 4/1994 | Hawes | 326/41 |
| 5,592,104 | 1/1997 | Bach | 326/27 |
| 5,596,285 | 1/1997 | Marbot et al. | 326/30 |
| 5,598,119 | 1/1997 | Thayer et al. | 327/111 |
| 5,604,450 | 2/1997 | Borkar et al. | 326/30 |
| 5,808,478 | 9/1998 | Andresen | 326/30 |
| 5,917,758 | 6/1999 | Keeth | 326/86 |

FOREIGN PATENT DOCUMENTS

| | | | |
|---|---|---|---|
| 0422391 | 9/1990 | European Pat. Off. | H03K 19/0185 |
| 0542227 | 11/1992 | European Pat. Off. | H03K 19/003 |
| 0591750 | 9/1993 | European Pat. Off. | H03K 19/003 |
| WO 91/20129 | 12/1991 | WIPO | H03K 19/003 |

*Primary Examiner*—Timothy P. Callahan
*Assistant Examiner*—Terry L. Englund

[57] ABSTRACT

An application specific integrated circuit for use with a circuit having particular electrical characteristic such as ringing or impedance. The circuit has an output pad with an output transistor having a drain connected to the output pad, and a gate connected to the drain of a predriver transistor. The output transistor has a gate-source capacitance characteristic, and the predriver transistor has a predriver time constant above a selected threshold based on the electrical characteristic. The first predriver transistor also has a selected resistance based on the predriver time constant and the gate-source capacitance characteristic, such that the first predriver is operable to switch the output transistor at a sufficiently slow rate to avoid ringing.

10 Claims, 4 Drawing Sheets

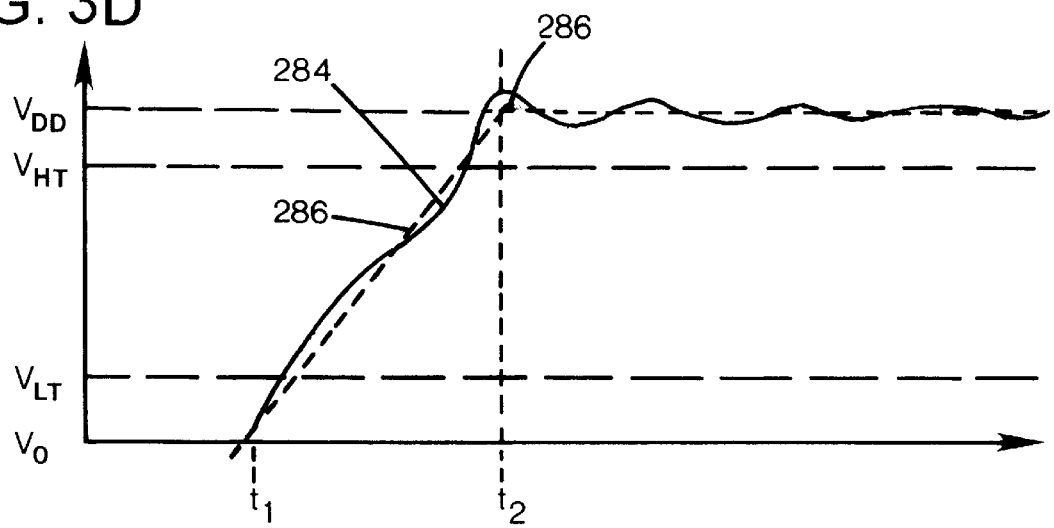
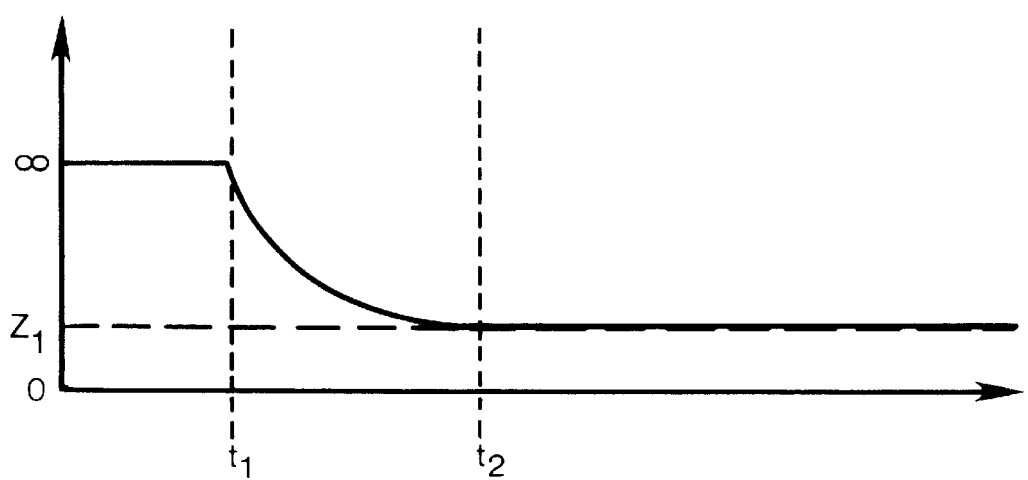

INTEGRATED CIRCUIT ASSEMBLY HAVING OUTPUT PADS WITH APPLICATION SPECIFIC CHARACTERISTICS AND METHOD OF OPERATION

REFERENCE TO RELATED APPLICATION

This is a continuation-in-part of U.S. patent application Ser. No. 08/960,408, entitled "INTEGRATED CIRCUIT ASSEMBLY HAVING OUTPUT PADS WITH PROGRAMMABLE CHARACTERISTICS AND METHOD OF OPERATION," filed Oct. 29, 1997.

FIELD OF THE INVENTION

This invention relates to methods and apparatus for driving an integrated circuit (IC) output pad, and more particularly to compensation for application specific electromagnetic interference (EMI).

BACKGROUND AND SUMMARY OF THE INVENTION

Electronic integrated circuits are provided with output pads to which external electronic circuitry is electrically connected. Output pads may provide a logic signal of "1" or "0", or an elevated or zero voltage to indicate a logic state. To overcome the impedance of the external circuitry, each pad is provided with a driver, typically in the form of a pair of FET transistors connected in series, with the junction between the two connected to the output pad, and the remote connections of the pair connected to a power line and to ground, respectively.

ICs are typically installed on a printed circuit assembly (PCA) with other components, and other circuit assemblies or devices may be connected to the PCA. The output pad may be required to drive a load remote from the IC, after transmission via metal traces on the PCA or via other conductors. The interactions of rapidly switching signals on these traces may generate an unwanted EMI problem. While rapid switching may be desirable for high speed circuit operation, this increases EMI noise. Therefore, circuits are evaluated and provided with EMI filtration components where EMI exceeds allowable levels. However, the addition of these components on the lines driven by an output pad changes the impedance of the line, which changes the requirements on the driver on the IC. For certain applications, an IC may be custom designed to have driver capabilities at each output pad precisely matched to the intended application and PCA on which it is to be installed. This would provide driving capabilities that are adequate to overcome external impedance, yet below a level that generates excessive EMI.

However, it is impractical or cost ineffective to design an IC twice: once to prototype the system for EMI analysis, and a second time with adequate drive capabilities to accommodate EMI reduction measures. Even when computer simulations of circuit performance are adequate to predict EMI measures and design adequate drivers in a single iteration, a separate chip design is required for each product or circuit assembly on which the chip is to be used.

Existing ICs have output pads with two drivers per pad, so that a driver may be disabled during operational periods when switching noise within the IC is excessive. Such a system is disclosed in U.S. Pat. No. 5,039,874 to Anderson, the disclosure of which is incorporated herein by reference. However, such systems do not accommodate the impedance variations generated by off-chip components and simply respond to excessive noise on a ground line.

Output pad requirements increasingly may require the driving of small loads at very high speeds. These drive speeds may include running at the internal speed of the ASIC, at up to the highest clock frequency. The use of such high frequencies may worsen various of the EMI parasitic parameters, including series inductance due to the ASIC wire bonds and chip package leads, parallel capacitance to adjacent leads and ground, and mutual inductive coupling between adjacent wires and leads. At the PCA, a transmission line effect may occur, giving rise to signal reflections that may cause serious ringing at the load. Ringing may produce ground bounce, supply line bounce, and EMI. When ringing is significant, it may generate apparent multiple data transitions at the load when only a single transition between logic states has occurred at the input, generating errors.

Ringing may be exacerbated by the effect of component resonances, and when such resonant frequencies are within the range of the data rate, external damping components are required, complicating the circuit design, and possibly requiring unwanted design iterations.

Existing designs have sought to overcome ringing concerns by using larger drivers to provide a faster edge or transition rate, and to delay reading of the signal for an interval to allow ringing to damp out. However, as data rates increase, there is inadequate time between data transitions to permit ringing to damp.

The present invention overcomes the limitations of the prior art by providing an application specific integrated circuit for use with a circuit having particular electrical characteristic such as ringing or impedance. The circuit has an output pad with an output transistor having a drain connected to the output pad, and a gate connected to the drain of a predriver transistor. The output transistor has a gate-source capacitance characteristic, and the predriver transistor has a resistance that produces a time constant above a selected threshold based on the electrical characteristic. The first predriver transistor also has a selected resistance based on the predriver time constant and the gate-source capacitance characteristic, such that the first predriver is operable to switch the output transistor at a sufficiently slow rate to avoid ringing.

BRIEF DESCRIPTION OF THE DRAWINGS

FIGS. 3b–3e are a series of timing diagrams illustrating operation of the embodiment of FIG. 2.

DETAILED DESCRIPTION OF A PREFERRED EMBODIMENT

Figure 1:
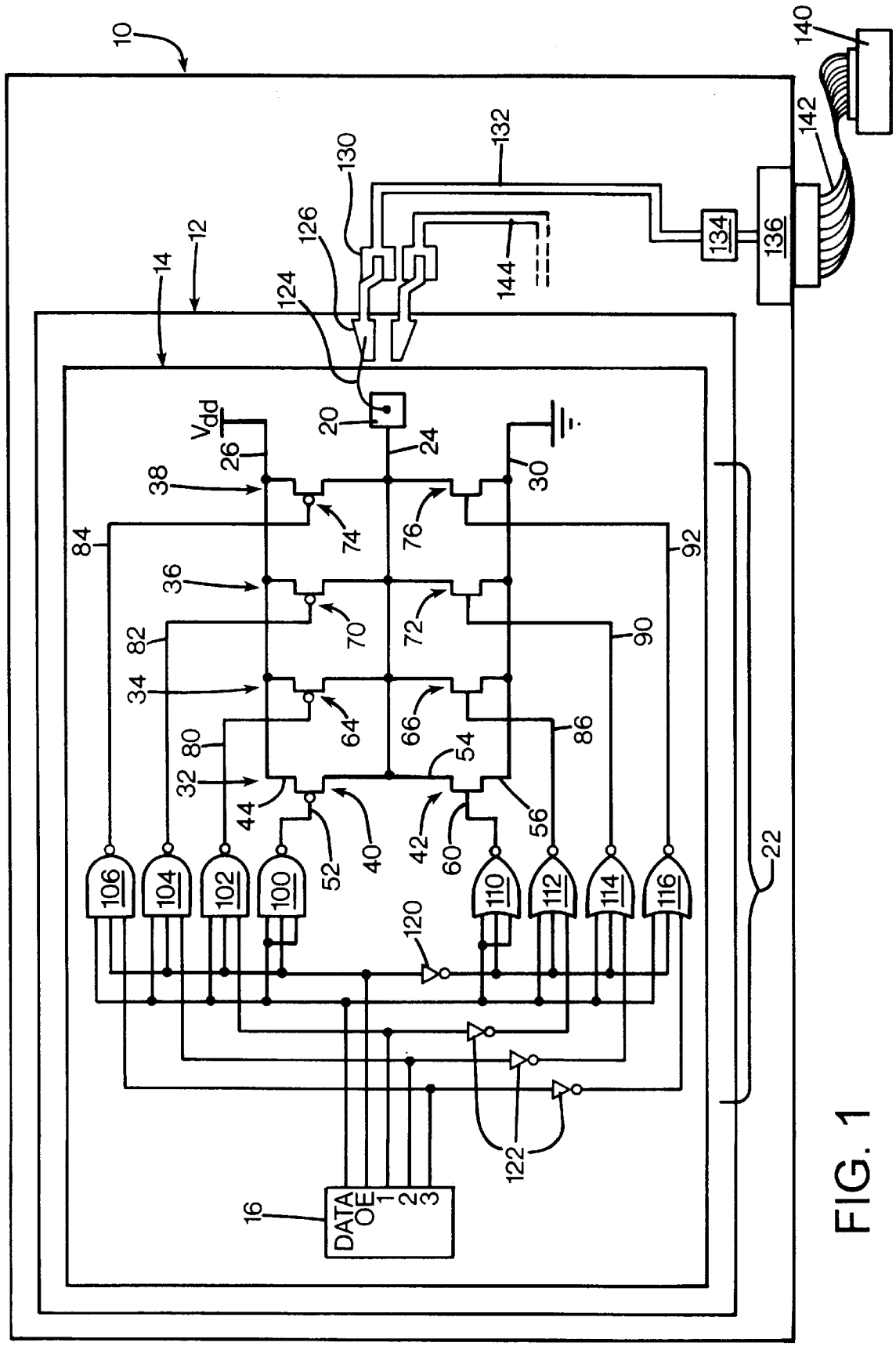
FIG. 1 is a schematic block diagram of a circuit according to a preferred embodiment of the invention.

FIG. 1 shows a printed circuit assembly 10 on which is mounted a chip carrier 12 carrying an integrated circuit (IC) chip 14. The chip includes a microprocessor logic controller 16 that is interconnected to control all chip functions. An output pad 20 represents one of numerous output pads for expressing a digital signal from the chip.

A pad driver circuit 22 has an output line 24 connected to the pad, a voltage line 26 connected to a voltage source Vdd, and a ground line 30 connected to ground. The driver circuit shown has four pad driver transistor pairs 32, 34, 36, 38. Each pair includes a p-channel FET and an n-channel FET connected with the p-FET drain connected to the n-FET drain, with the source of the p-channel FET connected to Vdd line 26 and the source of the n-channel FET connected to ground 30. Pair 32 includes p-FET 40 and n-FET 42. FET 40 has a first line 44 connected to Vdd line 26, a second line connected to the output line 24, and a gate 52. FET 42 has a first line 54 connected to the output line 24 and to the second line of FET 40, a second line 56 connected to the ground line 30, and a gate 60.

FET pairs 34 includes a p-FET 64 and an n-FET 66, pair 36 includes FETs 70 and 72, and pair 38 includes FETs 74 and 76. The p-FETs 40, 64, 70, and 74 are all connected to Vdd line 26, and n-FETs 42, 66, 72, and 76 are connected to ground line 30. The p-FETs 40, 64, 70, and 74 have respective gate lines 52, 80, 82, 84, and n-FETs 42, 66, 72, and 76 have respective gate lines 60, 86, 90, 92.

Each of the gate lines 52, 80, 82, 84 of the p-FETs is connected respectively to the output line of a NAND gate 100, 102, 104, 106. Each of the gate lines 60, 86, 90, 92 of the n-FETs is connected respectively to the output line of a NOR gate 110, 112, 114, 116. Each of the NAND and NOR gates has three inputs: a first data input connected to a DATA line on microprocessor 16, a second enable line connected to an output enable (OE) on the microprocessor, and a control line. An inverter 120 on the OE line between the processor and the NOR gates provides an inverted OE signal, while the NAND gates directly receive the original OE signal.

A separate control line is connected to each of the NAND gates, and each line is shared with a respective NOR gate. The processor 16 includes three control line outputs 1, 2, and 3, which is one less than the number of FET pairs. Control line 1 connects to NAND gate 102 and NOR gate 112, control line 2 connects to NAND gate 104 and NOR gate 114, control line 3 connects to NAND gate 106 and NOR gate 116. Gates 100 and 110 are wired with their control inputs directly connected to the data line so that they receive a high control bit when the data line is high. This ensures that these gates will always be on, while the others may be selectively utilized based on the processor's control bit output.

The NAND gates conventionally operate to provide a low or "0" output when all three inputs are high (causing an associated p-FET to conduct, and pulling the output line up to Vdd), and provide a high or "1" output when one or more of the inputs are low (preventing p-FET conduction). The NOR gates conventionally operate to provide a low or "0" output when one or more inputs are high (preventing an associated n-FET from conducting), and a high or "1" output when all inputs are low (pulling the output line down to ground.)

Thus, when the enable line OE is high and the data line switches high (as when a "leading edge" of a digital signal occurs) any control lines at high (including the data-following control line of gate 100) will cause their associated NAND gate to send a "0", causing some p-FETs to conduct. Meanwhile, the inverter 120 on the enable line will pass a low "0" signal to the enable lines of each of the NOR gates, which are effectively enabled by a "0" and disabled by a "1". Thus, a single enable bit will affect the entire circuit simultaneously.

On the data line, a "1" effectively enables or operates the NAND gates and disables the NOR gates, while a "0" functions conversely. Consequently, the data line circuit logic prevents enablement of any p-FETs when any n-FET is enabled, and vice versa, avoiding an intolerable connection between Vdd and ground within the chip.

On each of the control lines to the NOR gates, an inverter 122 takes a high control bit and inverts it to the low level needed to activate the gate, and conversely disables the selected gate when the microprocessor outputs a low control bit.

In the preferred embodiment, the FET transistors are sized in incremental multiples of two, providing a wide range of selectable aggregate effective sizes. The first p-FET 40 is the smallest size x, with p-FET 64 at 2x, p-FET 70 at 4x, p-FET 74 at 8x. Thus, with four transistors, the effective size of the transistor may range between 1x and 15x, in quantum increments of 1x, depending on which permutation of transistors is selected. In the preferred embodiment with FET 40 permanently wired to be on when enabled and data high, the possible aggregate sizes are 1x, 3x, 5x . . . 15x. Where finer increments are desired, the first transistor may be wired with a switchable control bit. The n-FETs are similarly sized, although the number of n-FETs may differ from the number of p-FETs, as may the progression of sizes.

As long as all FET outputs connect to the output pad, the FETs need not be arranged physically or conceptually in pairs, except that at least one of each type must be provided for basic pull up and pull down functions.

The chip 12 is supported by the chip carrier 14, and a tab or wire bond 124 connects the output pad 20 to a land 126 on the carrier. A multitude of other wire bonds connect other pads to other lands. The lands of the chip carrier are electrically connected to conductive terminals 130 on the printed circuit assembly 10 by conventional soldered connections. A conductive trace 132 extends to a filter component 134 near the PCA periphery, where a connector module 136 is connected to the trace, and to an external component or instrument 140 via a cable 142. The filter is typically a resistor, a resistor/capacitor, or a ferrite bead.

The selectable controls on the effective size of the pad drivers is used to optimize the driver strength for a specific application of the chip. In each application, the driver controls are adjusted to compensate for impedances that occur outside the chip, primarily on the PCA. On the PCA, an adjacent trace 144 near trace 132 may exhibit capacitive and inductive coupling with trace 132, generating unwanted EMI noise on either line in response to switching on the other. Either trace may also be subject to stray capacitances. Accordingly, after a prototype system is assembled, these EMI problems may be detected and identified. To cure the EMI problems, an appropriate filter 134 is connected to the trace 132 near the connector, to reduce EMI on the signal expressed at the connector to the external device 140. Typically, such filters slow the switching speed of the pad drivers, and additional transistor size is required to compensate. However, a large transistor size adequate for a heavily filtered trace will generate excessive noise on lines or in other applications of the same chip where filtering was not required. Therefore, the combination of transistors may be selected to provide adequate switching speed. In the design process, filtering and driver control codes may be iterated to optimize the settings.

Normally, after the driver control settings are established for each pad, they remain constant throughout use, avoiding the need for sensors, and reducing the demand on the microprocessor during operation. However, where these are not a concern, the system may include noise sensors on the chip or on the PCA circuitry to provide feedback to the microprocessor to enable it to adjust drive levels during normal operation.

To further reduce noise concerns, the microprocessor may trigger the control gates with pulses that are not simultaneous, but which may provide a stair step turn on of the FETs, or which may be slightly randomized. The control bits may be manipulated by an algorithm of the user's choice.

Alternative Embodiment

Figure 2:
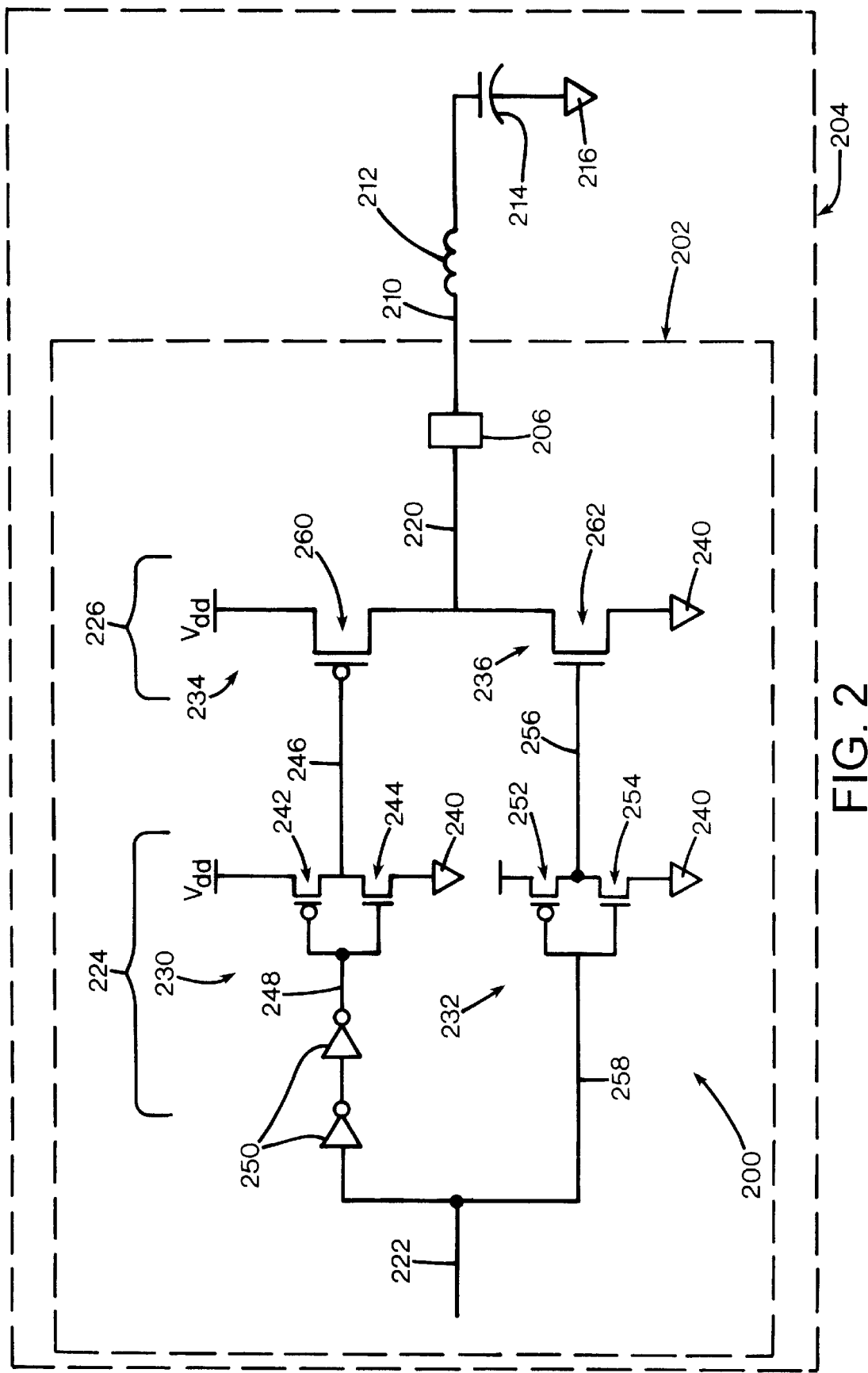
FIG. 2 is a schematic block diagram of a circuit according to an alternative embodiment of the invention.

FIG. 2 shows a pad driver circuit 200 on an application-specific integrated circuit (ASIC) chip 202 mounted on a printed circuit assembly (PCA) 204, or mounted on a chip carrier 12 mounted to a PCA. The chip includes a microprocessor controller (not shown) that is interconnected to control all chip functions. An output pad 206 represents one of numerous output pads for expressing a digital signal from the chip to other components on the PCA. A wire bond 210 is symbolically shown to illustrate its inherent function as an inductance element 212, and connects to a load 214 on the PCA. The load has capacitive characteristics, and is symbolized by a capacitor connected to ground 216. In typical applications the load is a CMOS load with a capacitance of 3–100 pF.

The pad driver circuit 200 has an output line 220 connected to the pad, and a data input line 222 connected to other logic circuitry on the chip. The pad driver circuit receives a switching logic signal from the input line and outputs a powered and conditioned signal that corresponds to the input signal. The output signal provided at the pad has adequate power to drive any connected loads, and is conditioned to avoid excessively rapid rise times and sharp transitions that generate ringing, transmission line effect, and other forms of EMI, as discussed above.

The pad driver circuit 200 includes a predriver portion 224 and a main driver portion 226. The predriver portion includes a first predriver 230 and a second predriver 232. The main driver portion includes a first main driver 234 and a second main driver 236. Each predriver includes a transistor pair. Each pair includes a p-channel FET and an n-channel FET, with the p-channel FET source connected to a voltage source Vdd, the n-channel FET source connected to a ground line 240, and the p-FET and n-FET drains connected to each other.

The first predriver 230 includes p-FET 242 and n-FET 244, with their drains connected to a predriver output line 246 extending to main driver 234. The gates of FETs 242 and 244 are connected to a first input line branch 248 that extends to the data input line 222. A pair of inverters 250 are serially connected on the first input line branch, and are selected with parameters to avoid simultaneous operation of both main drivers at signal transitions, which would create an unwanted connection between Vdd and ground. The second predriver 232 includes p-FET 252 and n-FET 254, with their drains connected to a predriver output line 256 extending to main driver 236. The gates of FETs 252 and 254 are connected to a second input line branch 258 that extends to the data input line 222.

In the main driver portion 226, the first main driver 234 is a p-FET 260 with its source connected to Vdd, a gate connected to the first predriver output line 246, and a drain connected to output line 220. The second main driver 236 is an n-FET 262 with its source connected to ground, a gate connected to the second predriver output line 256, and a drain connected to output line 220.

In the illustrated embodiment, the main drivers are static impedance matched to the expected impedance of the circuitry to which they will be connected. Normally, a standard impedance (in this case 80Ω) is selected, and used as the standard for designing circuitry and for selecting components in the associated device. In some alternative approaches, a custom impedance may be selected to match a particular associated portion of a particular circuit that departs from a nominal standard impedance. By any type of impedance matching, transmission line effects are reduced or avoided.

The predriver FETs are sized to provide a relatively slow turn on period or time constant, as will be discussed below with respect to the circuit operating principles. In particular, the n-channel FET 244 and p-channel FET 252 are critical, because they are involved in the activation of their associated main drivers 234, 236. With a time constant established as discussed below to exceed a threshold set to avoid ringing, the impedance of the predriver FETs is set based on the expected or measured capacitive characteristics of the associated main driver, as measured between the main driver gate and Vdd (in the case of driver 234) or ground (in the case of driver 236). By using standard circuit modeling techniques such as SPICE, the parameters of device 244 may be iteratively adjusted to arrive at a suitable output time constant.

In the illustrated embodiment, predriver impedance values in the range of 2–20Ω are anticipated to be suitable for use with expected circuit ringing resonances, and with expected main driver parameters (selected to match expected circuit impedances). As CMOS or related manufacturing processes advance, the impedance range may shift.

Figure 3A:
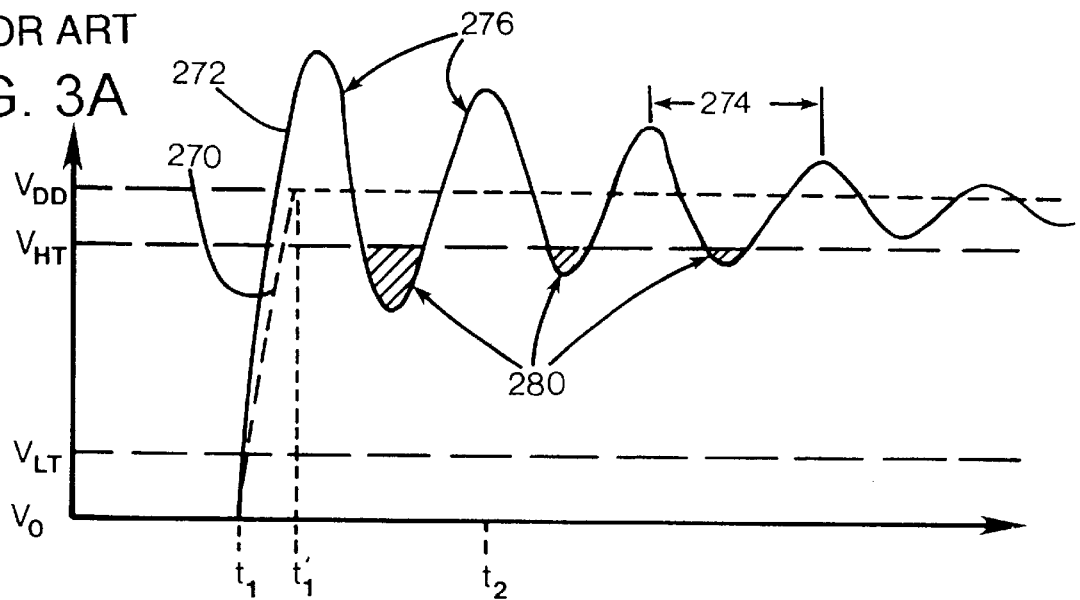
FIG. 3a is a timing diagram illustrating operation of a prior art apparatus.
Figure 3B:
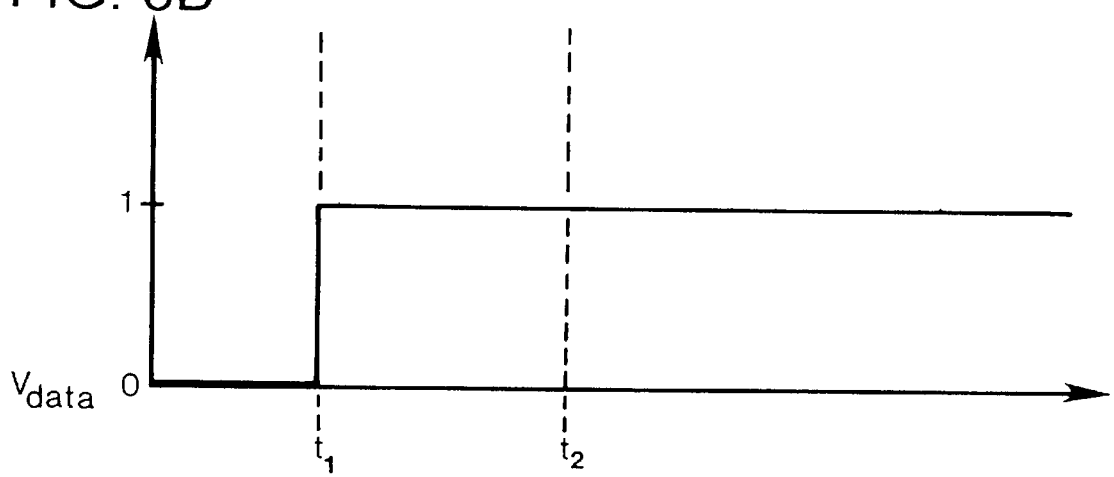

FIG. 3a illustrate several electrical characteristics of a prior art circuit without the features of the illustrated embodiment. FIGS. 3b–3e show characteristics according to the illustrated embodiment of FIG. 2, all on a common time domain. FIG. 3a illustrates how external circuitry such as a bond wire and off-chip load may respond with high frequency ringing when a relatively fast output driver is given a data signal transition such as shown in FIG. 3b. The data signal is switched from low (0) to high (1) at time t1, and the resulting output voltage V data ideally rises from V0 on a straight, steep ramp 270 to Vdd at time t1', and continues flat at Vdd until further switched.

However, with attached circuitry causing ringing, the actual voltage 272 fluctuates in response to circuit ringing as it rises past Vdd, then damps out over time to Vdd. The ringing has a frequency that may be measured experimentally or derived theoretically during circuit modeling or design. A period 274 of one full ringing cycle may be easily calculated, and is illustrated in FIG. 3a. When the output overshoots, rising to peaks 276 significantly above Vdd, breakdown may occur. The high signal is valid above a high threshold Vht moderately below Vdd. Below a low threshold Vlt moderately above V0, a signal is read as valid low. Between the low and high thresholds, the signal is read as invalid, such as at invalid ringing minima 280. The negative transition of the signal downward through the high threshold at the beginnings of each such minimum may generate a false trigger. While short-lived ringing may be acceptable for less demanding circuits that can wait an interval before reading the V data level, it is unacceptable in faster circuits that must read the voltage as early as time t2.

Figure 3C:
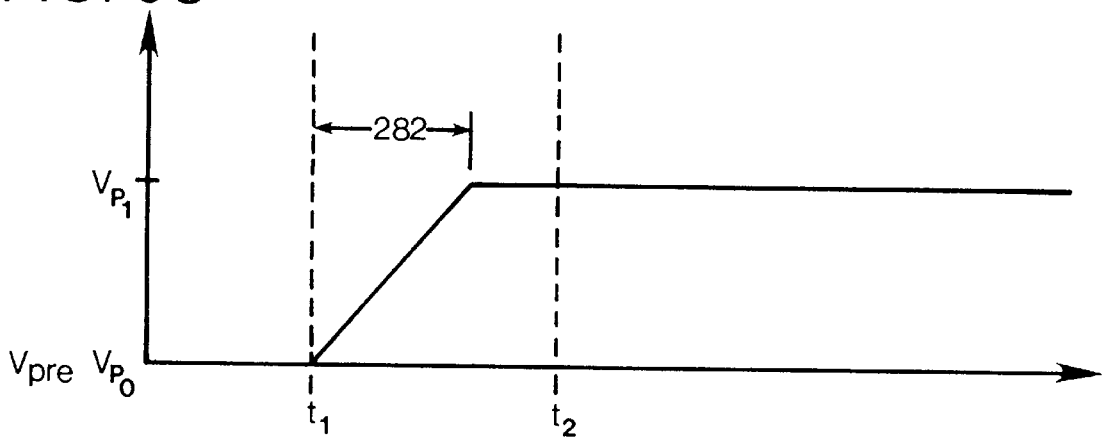

To reduce or effectively eliminate the harmful ringing caused by the high current of a rapid transition, the predriver is sized to turn on slowly, over an interval at least half the ringing period, and preferably at least as great as a full ringing cycle period, with 1¼ periods shown in FIG. 3c. FIG. 3c shows voltage V pre measured at the output of a predriver, which rises from Vp0 to Vp1 over a relatively straight slope, over a time interval 282, which in the illustrated case is equal to the ringing period 274 shown in FIG. 3*a*. As discussed above, the interval is set by setting the predriver resistance to a value that provides an appropriate time constant, also based on the capacitance of the main driver.

FIG. 3*d* shows the ideal output voltage 286 rising on a straight and relatively gentle slope from V0 to Vdd over the time interval t1–t2, and proceeding flat after t2. Due to ringing effects, the actual output voltage 284 of the main driver (driven by the predriver voltage of FIG. 3*c*) fluctuates above and below the ideal voltage line at the ringing frequency, which is damped substantially due to the slower turn on period, but which is not eliminated or changed in frequency. With the turn-on ramp period t1–t2 set at 1¼ of the ringing period, the second ringing maximum 284 coincides with the transition to an ideally flat signal, providing a relatively sharp peak. The slight ringing-induced variances are within tolerated thresholds, and damp relatively quickly due to their small initial amplitude.

As with standard FET devices, the main driver provides a response time that is a function of input voltage. When the input voltage is low, the main driver provides very limited current, resulting in a small slope or edge rate. As the input voltage rises to intermediate levels, the output current increases. Only after the input voltage rises to a maximum level, or to a threshold minimally below the maximum level, does the output current reach potentially maximum rates. However, as shown, the output voltage has already nearly reached the desired output voltage V1 when the input voltage V pre has peaked. Thus, any ringing response to this maximum current is mitigated by the averaging effect of any response to earlier smaller current, and will occur after the signal has passed a critical threshold. This avoids retrograde inflection errors that are most critical only during the rise of the signal.

By delaying the full current phase until after at least one half cycle of the ringing frequency has transpired, the downward inflection that can occur at one half cycle will be mitigated. By delaying the full current phase to a full cycle, further mitigation is provided, and subsequent ringing is damped. For the most sensitive applications, the turn on phase interval 274 may be increased to the full interval between t1 and t2 during which the output is expected to rise. Setting the predriver parameters need only be limited by the speed of the circuit, with the slow predriver and fast main driver combining to provide versatile operation to drive circuits operating at high speeds, and having a wide range of load requirements.

The resulting effective impedance Z of the main driver is shown in FIG. 3*e*, which shows the impedance at an infinite level before t1, then dropping asymptotically during a first dynamic damping phase between t1 and t2 to Z1, which is set as discussed above to match the impedance of the main driver to the external circuitry. Following t2, the impedance is statically matched.

While the above is discussed in terms of preferred and alternative embodiments, the invention is not intended to be so limited. For instance, while the graphs of FIGS. 3*b*–3*e* show a rising signal switching from low to high, the same principles apply to a falling signal.

What is claimed is:

1. A method of manufacturing an application specific integrated circuit having an output driver receiving a data signal via a predriver, for use with a selected circuit assembly comprising the steps:

establishing an output driver impedance;

determining a circuit ringing frequency value for a selected circuit portion of the circuit assembly; and establishing a predriver time constant greater than half the period of the ringing frequency, such that the predriver turns on slowly enough to dampen ringing.

2. The method of claim 1 wherein establishing a predriver time constant includes determining the capacitance of the output driver, and selecting a predriver resistance based on the capacitance.

3. The method of claim 1 wherein the predriver time constant is greater than the period of the ringing frequency.

4. The method of claim 1 including connecting the output driver to the selected circuit portion.

5. The method of claim 1 wherein determining the circuit ringing frequency includes determining an inductance and capacitance value for the selected circuit portion.

6. The method of claim 1 wherein establishing an output driver impedance includes substantially matching the output driver impedance to an impedance value associated with the selected circuit portion.

7. A method of designing an application specific integrated circuit for a circuit having a selected circuit portion with an impedance characteristic and a ringing frequency having a cycle period, the method comprising the steps:

establishing an output driver size to substantially match the impedance characteristic of the selected circuit portion;

determining the capacitance of the output driver;

determining a predriver time constant greater than at least half of the cycle period; and establishing a predriver size based on the time constant and the output driver capacitance.

8. The method of claim 7 wherein the predriver time constant is at least the cycle period.

9. The method of claim 7 including determining an inductance and capacitance value for the selected circuit portion.

10. The method of claim 7 wherein establishing an output driver size includes substantially matching the output driver impedance to an impedance value associated with the selected circuit portion.

* * * * *